United States Patent
Wu

[19]

[11] Patent Number: 6,136,697
[45] Date of Patent: *Oct. 24, 2000

[54] VOID-FREE AND VOLCANO-FREE TUNGSTEN-PLUG FOR ULSI INTERCONNECTION

[75] Inventor: Shye-Lin Wu, Hsinchu, Taiwan

[73] Assignee: Acer Semiconductor Manufacturing Inc., Hsinchu, Taiwan

[ * ] Notice: This patent is subject to a terminal disclaimer.

[21] Appl. No.: 09/122,825

[22] Filed: Jul. 27, 1998

[51] Int. Cl.$^7$ ................................................. H01L 21/4763
[52] U.S. Cl. .......................... 438/648; 438/649; 438/651; 438/653; 438/656; 438/660; 438/663; 438/672; 438/675; 438/775
[58] Field of Search .................................... 438/233, 649, 438/653, 648, 651, 656, 660, 663, 672, 675, 775

[56] References Cited

U.S. PATENT DOCUMENTS

| | | | |
|---|---|---|---|
| 5,552,340 | 9/1996 | Lee et al. | 437/190 |
| 5,554,565 | 9/1996 | Liaw et al. | 437/192 |
| 5,672,543 | 9/1997 | Chang et al. | 437/192 |
| 5,899,741 | 8/1999 | Tseng et al. | 438/649 |

OTHER PUBLICATIONS

Annie Tissier et al., Planarization of Pre–Metal and Metal Levels for 0.5 µm and 0.35 µm Logic *CMOS Processes.*, 1994 Proceeding On Advanced Metallization for ULSI Applications, pp. 341–349.

*Primary Examiner*—David Hardy
*Assistant Examiner*—José R Diaz
*Attorney, Agent, or Firm*—Harness, Dickey & Pierce, P.L.C.

[57] ABSTRACT

The present invention is a method of fabricating void-free and volcano-free tungsten plugs. A silicon film was formed over contact hole surfaces for restricting the reflow of a dielectric layer. A titanium film is formed over the silicon layer. By performing a thermal process to the silicon layer and the titanium layer in a nitride-containing environment, the etching damage to the substrate can be recovered and a silicon silicide and a titanium nitride can be formed. The contact resistance of plugs can be significantly reduced, when compared with known technology. The undesired formation of voids and volcano can be eliminated. The method can be employed to fabricate defect-free advanced ULSI devices.

14 Claims, 4 Drawing Sheets

VOID-FREE AND VOLCANO-FREE TUNGSTEN-PLUG FOR ULSI INTERCONNECTION

FIELD OF THE INVENTION

The present invention relates to semiconductor fabrication, and, more specifically, to a method of metallization. A void-free and volcano-free process for forming tungsten plugs is provided for multi-level metallization and interconnection manufacturing processes.

BACKGROUND OF THE INVENTION

The semiconductor has been developed for four decades from the birth of the first semiconductor device. For performing more complicate operations with higher speed, more and more devices and connections are being formed within integrated circuits. The density of semiconductor chips are raised to include more devices and functions in a single chip. In the integrated circuits, a great number of devices and connections are fabricated on a single chip. Various kinds of devices like transistors, resistors, and capacitors are formed together. Each device must operate with good connections to provide interaction between each other for enabling the functionality and the operation of the circuits, especially under the higher and higher packing density of integrated circuits.

Connections must be formed in addition to these densely arranged devices for finishing a circuit to perform operations. In the semiconductor manufacturing process, metallization is a process to form connections between devices. With more and more devices on a chip with high integrity, early stage single layer metallization process had been improved to form multiple layer of connections. Two layers, three layers, or even four layers of connections are formed in present applications. With the sub-micrometer or even smaller devices, the metallization process is challenged with forming narrower conductive lines with compromising resistance and high yield. More layers of defect-free connections must be formed with low production cost and reduced thermal budget.

For fabricating high density devices like advanced ULSI (ultra-large scale integration) devices, the borophosphosilicate glass (BPSG) film has been widely used as the pre-metal dielectric (PMD), inter-layer dielectric (ILD), or inter-metal dielectric (IMD) layers to achieve global planarization. A. Tissier et al. introduced the characteristics of dielectric materials as pre-metal layers in their work "Planarization of Pre-metal and Metal Levels for 0.5 $\mu$m and 0.35 $\mu$m logic CMOS Processes" (Proceedings on Advanced Metallization for ULSI Applications, p. 341, 1994). They addressed that in developing 0.35 micrometer CMOS logic processes, it has become clear that a strong increase in the number of interconnect levels is mandatory, in order to use the tremendous transistor density available in the silicon. The borophosphosilicate glass film formed by tetra-ethyl-ortho-silicate (TEOS) are introduced as one of the choices of pre-metal dielectric layers in fabricating advanced ULSI devices.

However, the high temperature anneal after opening the contact hole will induce the borophosphosilicate glass film reflowing to form an overhang structure at the top of contact holes. In the U.S. Pat. No. 5,554,565 titled "Modified BP-TEOS Tungsten-Plug Contact Process" to J. J. Liaw et al., the problem of void formation during metallization is illustrated. In the introduction of prior art processes in their invention, a rapid-thermal-annealing (RTA) was performed to activate implanted ions. A borophosphosilicate glass film was flowed at contact hole edges and severely encroach into the contact opening under high temperature. The encroachment of the borophosphosilicate glass film into the contact opening causes a restriction to the filling of the contact hole by the tungsten leaving a void in the center. The formation of voids causes the thinning of the filling tungsten plug and increases the resistance of interconnect wires. The thin tungsten walls surrounding the void cause a potential problem of subsequent electrical failure.

In addition to the problem of increased resistance of interconnect wires and electrical failures under void formation, another possible damage to the interconnection structure comes from the volcano formation. For typical tungsten-plug technology, the adhesion of pure tungsten to the sides of the silicon oxide contact hole is poor and the applying of an adhesion layer like titanium nitride is needed before tungsten deposition. The precursor of tungsten hexafluoride ($WF_6$) will penetrate the titanium nitride film and react with underlying titanium layer to form the by-product $TiF_3$. The formation of the non-adherent $TiF_3$ layer and $TiF_3$ gas causes the tungsten layer or the titanium nitride layer to peel and damages the devices, the disastrous effect being known as tungsten volcano effect.

C. R. Chang et al. described the volcano effect in the U.S. Pat. No. 5,672,543 titled "Volcano Defect-Free Tungsten Plug". They introduced that the nucleation step of the tungsten chemical vapor deposition process has a $WF_6$ gas rich chamber condition. The $WF_6$ gas penetrates through the titanium layer and react with the titanium molecules to form $TiF_3$ gas. The continuous out-gassing of $TiF_3$ through the deposited Tungsten film will create a mountain-shaped opening on top of the tungsten film and the defect is the so-called volcano defect.

Therefore, a method of solving the problem caused by the void formation and the volcano defect is highly needed in the field silicon processing. A void-free and volcano-free process must be provided for fabricating defect-free advanced ULSI devices.

SUMMARY OF THE INVENTION

The present invention discloses a method of fabricating void-free and volcano-free plugs. The prior art problem of high plug resistance and potential electric failures of interconnection wires caused by void effect can be solved. The peeling of tungsten plugs under volcano effect can also be avoided.

The method of metallization in the present invention includes the following steps. At first, a semiconductor substrate is provided with transistors formed over. A dielectric layer is formed over the substrate and a portion of the dielectric layer is removed to form a contact hole. A silicon layer is then formed over the contact hole and over the dielectric layer. A titanium layer is formed over the silicon layer. The substrate is subjected to a thermal process in a nitride containing environment. A conductive plug is then formed in the contact hole. A conductive layer is then formed over the substrate to connect with the conductive plug. An anti-reflection layer can be added optionally to be formed over the conductive layer. Finally, interconnection lines are defined on the conductive layer.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings as follows.

DETAILED DESCRIPTION OF THE PREFERRED EMBODIMENT

The present invention proposed a method of fabricating void-free and volcano-free plugs. A silicon film was formed to restrict the reshaping of a dielectric layer near a contact hole. By performing a thermal process to the silicon layer and an overlying titanium layer in a nitride-containing environment, the etching damage to the substrate is recovered and a silicon silicide and a titanium nitride can be formed. The contact resistance of plugs can be significantly reduced, in comparing with the prior art. The undesired formation of voids and volcano can be eliminated and the method can be employed to fabricating defect-free advanced ULSI devices. The method for forming a multilayer connections is described as follows.

Figure 1:
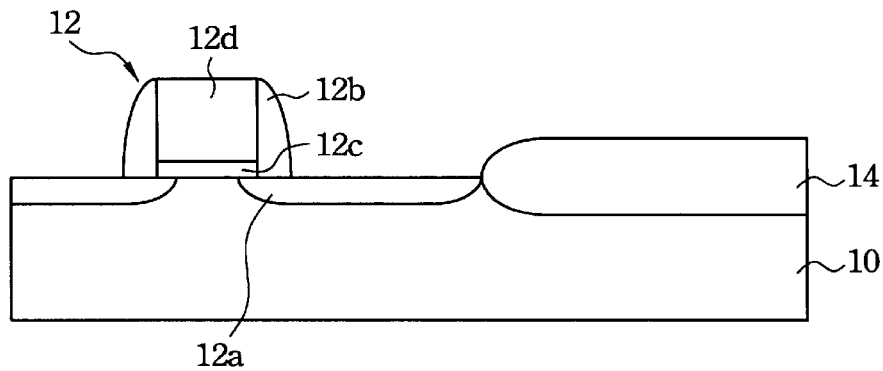
FIG. 1 illustrates a cross-sectional view of a semiconductor substrate with transistors formed over in accordance with the present invention.

Referring to FIG. 1, a cross-sectional view of a semiconductor 10 is illustrated. The semiconductor substrate 10 had been finished with the forming of operational devices like transistors, resistors, and capacitors. For a focused illustration of the present invention, only a concentrated region of a transistor structure and an isolation region 14 is shown in the figure. A field oxide isolation structure 12, including gate electrode 12d, gate insulator 12c, spacer 12b and source/drain region 12a or named "junction region" is employed as the isolation region 14 in the example and other kinds of isolation technology can be applied alternatively with different device design and needs. Without limiting the scope of the invention, the cross-sectional view is illustrated only for introducing the plug-forming process in the present invention.

Figure 2:
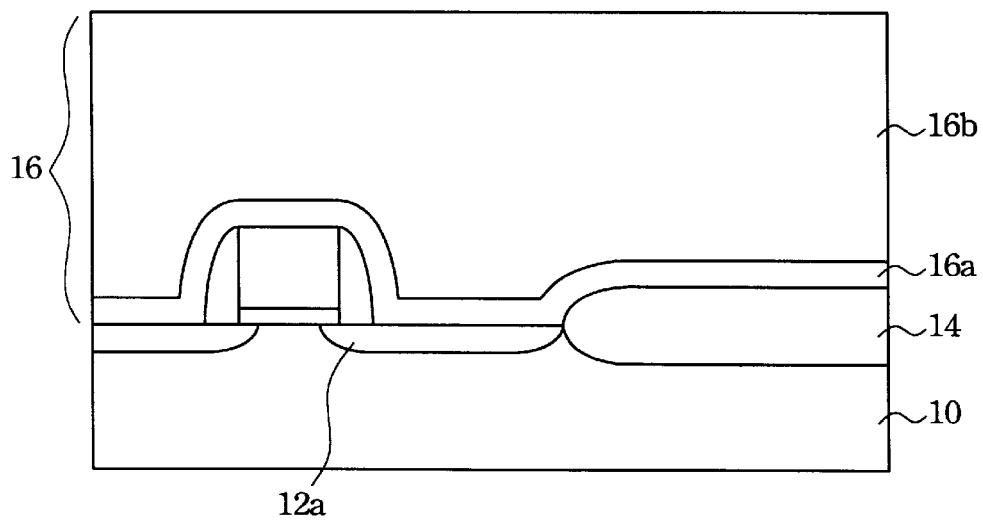
FIG. 2 illustrates a cross-sectional view of forming a dielectric layer over the substrate in accordance with the present invention.
Figure 3:
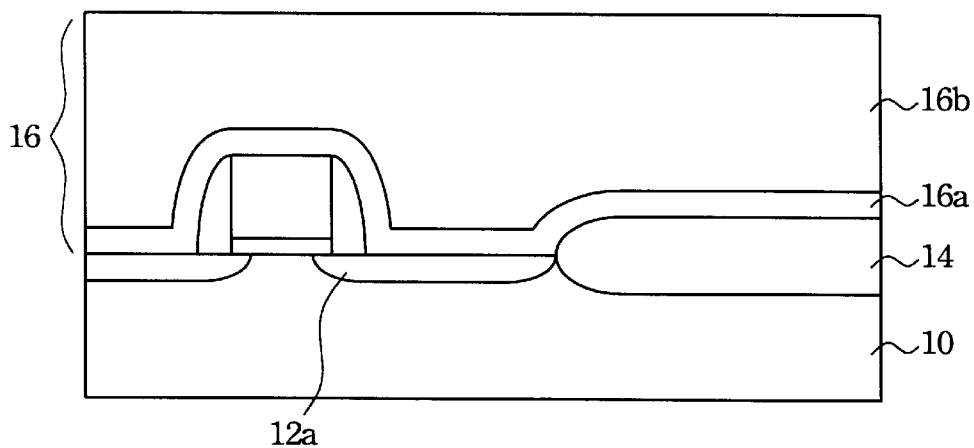
FIG. 3 illustrates a cross-sectional view of etching-back the dielectric layer in accordance with the present invention.

Referring to FIG. 2, a dielectric layer 16 is formed over the substrate 10. As a preferred embodiment, the dielectric layer 16 can include two dielectric layers. The underlying first layer is an undoped oxide layer 16a, which can be formed with a tetra-ethyl-ortho-silicate (TEOS) chemical vapor deposition (CVD) process. The second layer formed over the undoped layer 16a is an doped oxide layer 16b. A borophosphosilicate glass (BPSG) layer can be utilized as the doped oxide layer 16b for its good flowing characteristics under high temperature. The undoped underlying oxide layer is employed to prevent the substrate 10 from the dopant pollution of the borophosphosilicate glass layer 16b. The borophosphosilicate glass layer 16b is formed preferably also with a tetra-ethyl-ortho-silicate (TEOS) chemical vapor deposition (CVD) process. The borophosphosilicate glass layer 16b is reflowed after the deposition to provide improved topography. An etching-back planarization process can be performed to remove a portion of the borophosphosilicate glass layer 16b located on top, as shown in FIG. 3.

Figure 4:
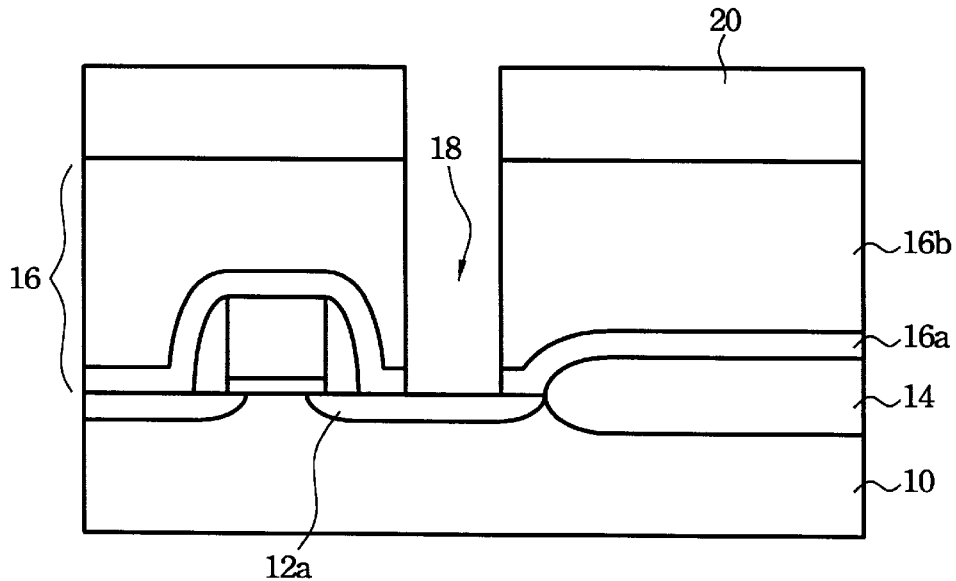
FIG. 4 illustrates a cross-sectional view of removing a portion of the dielectric layer to form a contact hole in accordance with the present invention.

Turning to FIG. 4, a portion of the dielectric layer 16, including the two layers 16a and 16b, is removed to form a contact hole 18. The contact hole is defined to extend down to an active region, like a junction region 12a indicated in the figure, to make contacts. The contact hole 18 can be defined with a well-known lithography process and a dry etching process. A photoresist layer 20, as indicated in the figure, can be employed in the lithography process to define the region of forming contact holes on the substrate 10. The photoresist layer 20 is then removed after the contact hole 18 is defined.

Figure 5:
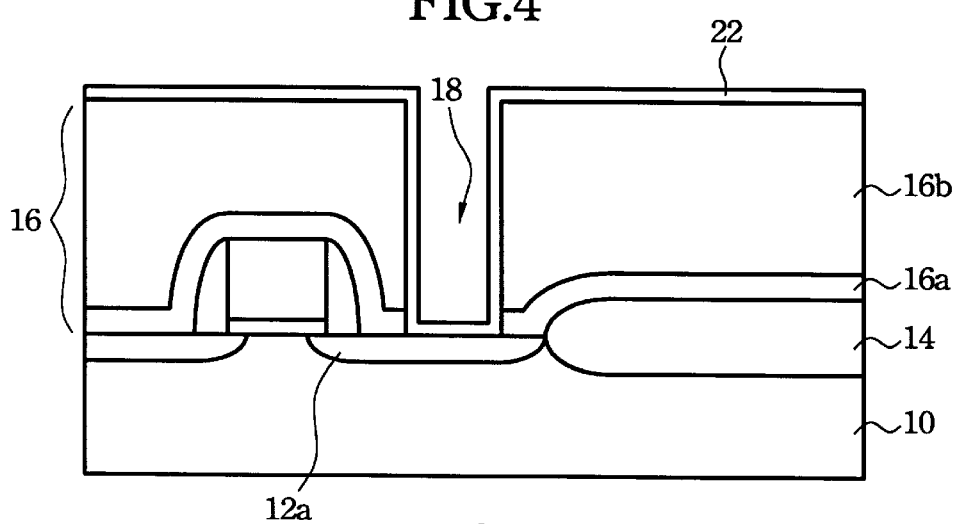
FIG. 5 illustrates a cross-sectional view of forming a silicon layer over the contact hole and over the dielectric layer in accordance with the present invention.

A silicon layer 22 is formed over the contact hole 18 and over the dielectric layer 16, as shown in FIG. 5. The silicon layer 22 is utilized to cover over the borophosphosilicate glass layer 16b for constraining the shape of the contact hole 18 during laterly-performed high temperature thermal processes. In the case, the silicon layer 22 can be a thin amorphous silicon layer. The thin amorphous silicon layer can be formed with a chemical vapor deposition process with a thickness between about 200 to about 1000 angstroms.

Figure 6:
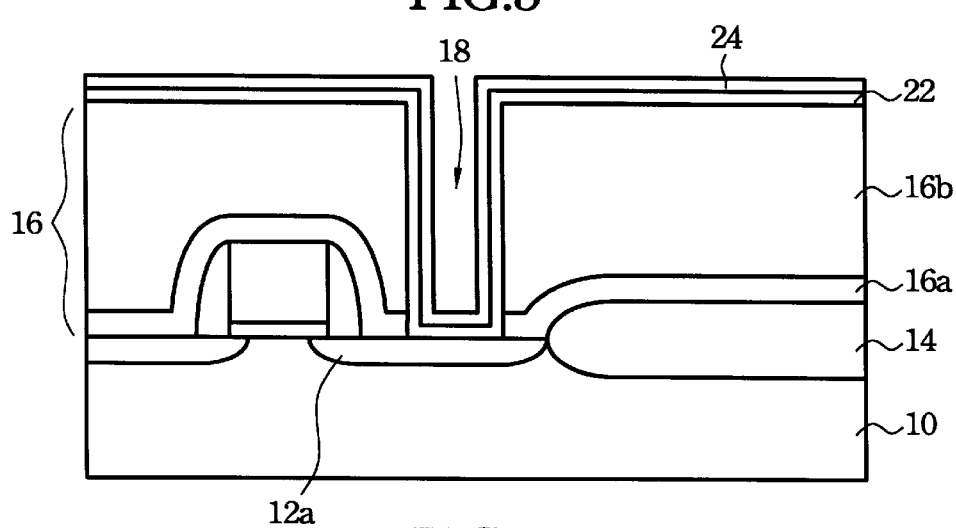
FIG. 6 illustrates a cross-sectional view of forming a titanium layer over the silicon layer in accordance with the present invention.

Turning to FIG. 6, a titanium layer 24 is then formed over the silicon layer 22. A thin collimated titanium layer is preferred as the titanium layer 24 in this case, although non-collimated titanium layer can be used alternatively. The titanium layer 24 can be formed either by a chemical vapor deposition process or a physical vapor deposition process (PVD) like sputtering, with a thickness between about 200 to about 1000 angstroms.

Figure 7:
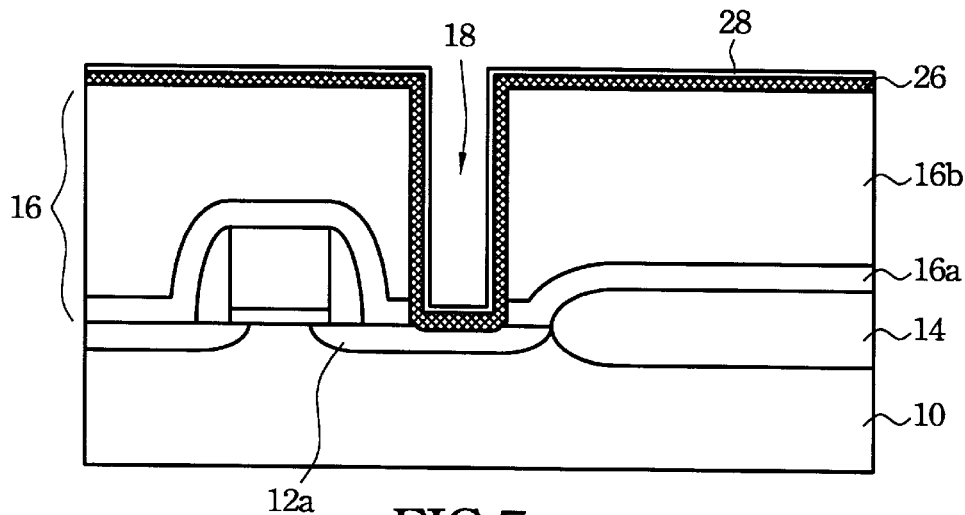
FIG. 7 illustrates a cross-sectional view of performing a thermal process in a nitride containing environment to the substrate in accordance with the present invention.

Referring to FIG. 7, a thermal process is then performed to the substrate 10. A rapid thermal process (RTP) can be performed in a nitride containing environment at a temperature between about 650° C. to about 900° C., which is so-called rapid thermal nitride (RTN) process. In this case, the nitride-containing ambient can be an ammonia ($NH_3$) ambient or a nitrogen ($N_2$) ambient. The silicon layer 22 and the titanium layer 24 are annealed to form a titanium-silicide layer 26 and a titanium nitride layer 28 under the high temperature reaction of the thermal process. By the covering of the silicon layer 22, the underlying borophosphosilicate glass layer 16b can be prevented from shape-damaging reflow under the high temperature. Thus the shape of the contact hole 18 can be maintained well and the prior art problem of void-formation can be avoided.

In addition, the etching damage to the substrate 10 during the contact hole etching process can also be cured with the thermal process. The thermal budget of the conventional process can be saved by performing reduced number of thermal processes in the method of the present invention. By reacting the silicon layer 22 and the titanium layer 24 to form the titanium-silicide layer 26 and the titanium nitride layer 28 without remaining titanium, the prior art volcano effect of forming $TiF_3$ gas can be eliminated. The peeling problem of a later-formed plug can be avoided.

C. Y. Lee et al. illustrate the nitridation process of titanium in the U.S. Pat. No. 5,552,340 titled "Nitridation of Titanium, for Use with Tungsten Filled Contact Holes". In the process of their invention, an adhesive layer of titanium is deposited in the contact hole firstly. A rapid thermal anneal cycle is performed in an ammonia ambient to create a thin, uniform, barrier layer of titanium nitride. They also disclosed that the titanium nitride protects the underlying titanium adhesion layer from the by-products introduced during the tungsten deposition, specifically the evolution of fluorine ions resulting from the decomposition of tungsten hexafluoride ($WF_6$).

Figure 8:
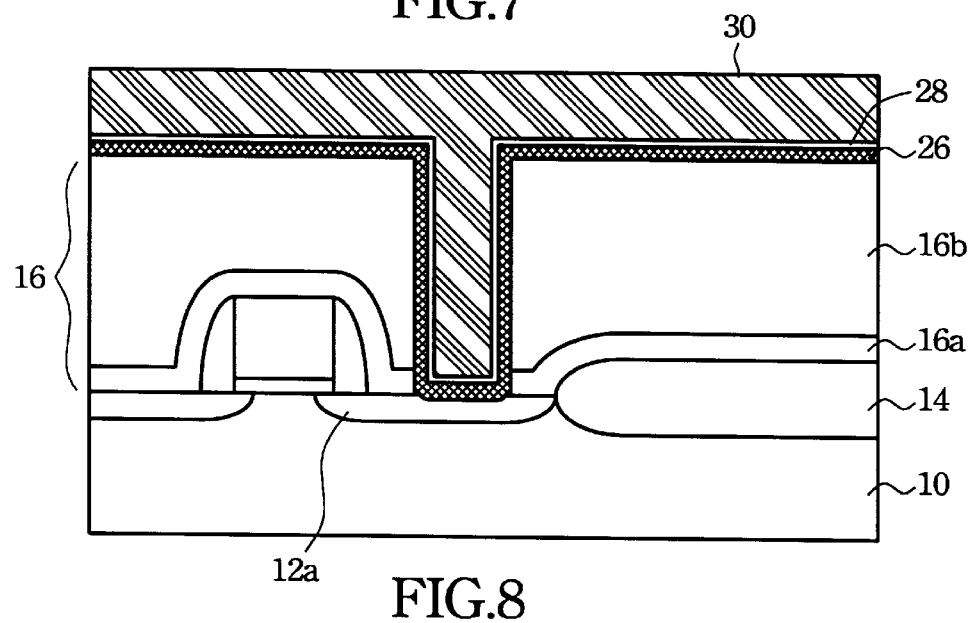
FIG. 8 illustrates a cross-sectional view of forming a tungsten layer over the substrate in accordance with the present invention.
Figure 9:
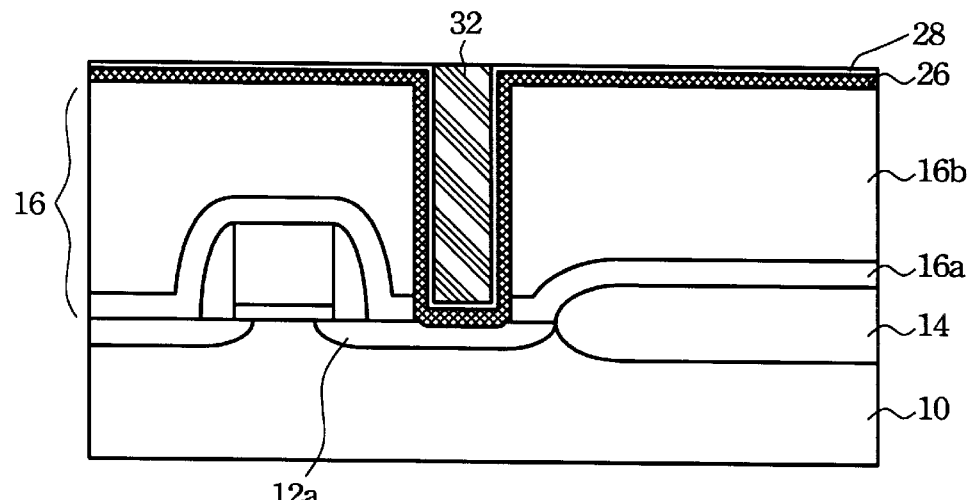
FIG. 9 illustrates a cross-sectional view of defining a conductive plug in the contact hole in accordance with the present invention.

Turning to FIG. 9, a conductive plug 32 is then formed in the contact hole 18. In the case, a tungsten plug is employed preferably as the conductive plug. The tungsten plug, 32 can be formed by depositing and etching back a tungsten layer. In FIG. 8, the deposition of a tungsten layer 30 by a chemical vapor deposition process is illustrated.

Figure 10:
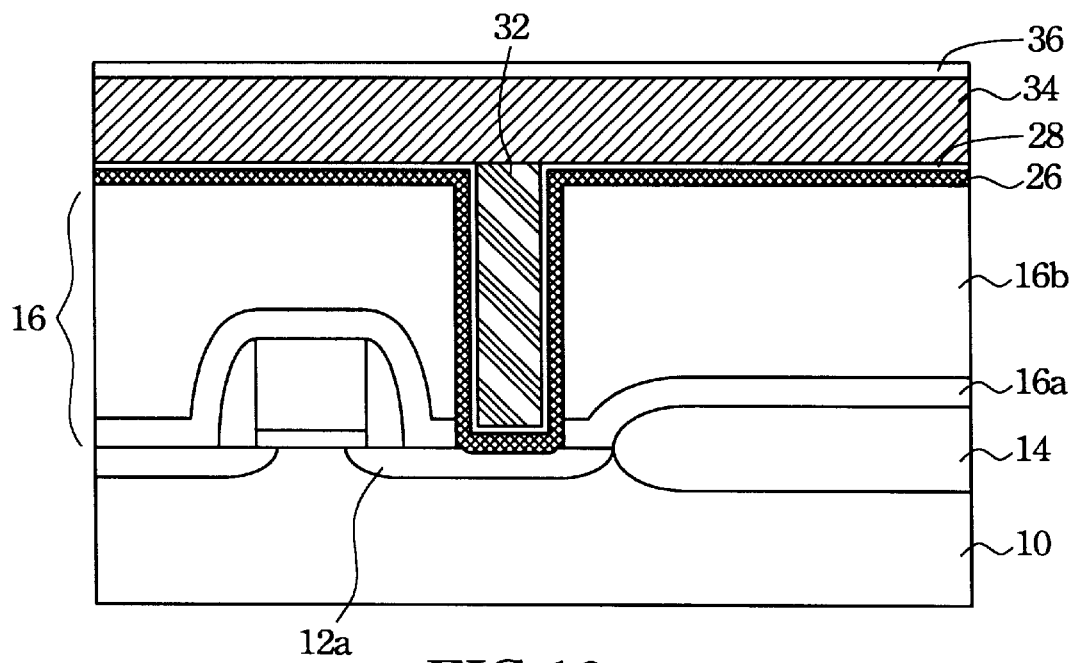
FIG. 10 illustrates a cross-sectional view of forming a conductive layer and an anti-reflection layer over the substrate in accordance with the present invention.
Figure 11:
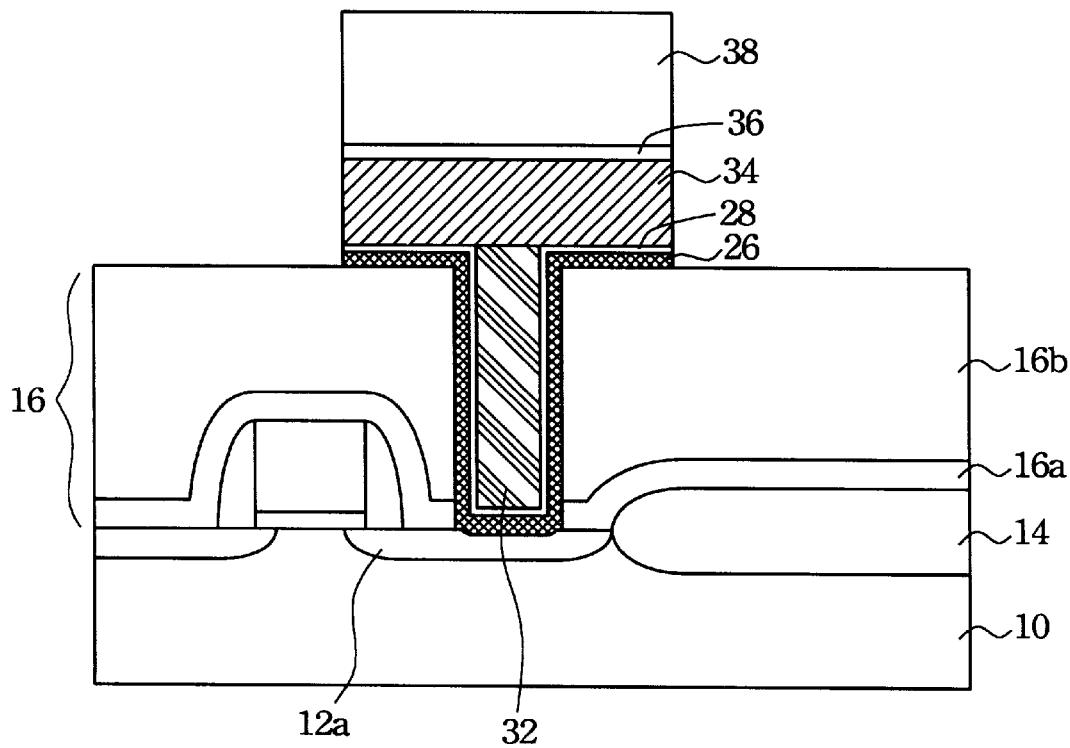
FIG. 11 illustrates a cross-sectional view of defining interconnection lines on the conductive layer in accordance with the present invention.

After the formation of the tungsten plug 32, a conductive layer 34 is formed over the substrate 10 to connect with the tungsten plug 32, as shown in FIG. 10. For providing low interconnection resistance, an aluminum—cooper (Al—Cu) layer can be employed preferably as the conductive layer 34. In addition to the conductive layer 34, an anti-reflection layer 36 can be optionally added and formed over the conductive layer 34 before defining interconnection metal lines. A titanium nitride layer is utilized as the anti-reflection layer 36 in this case to improve the accuracy of defining interconnection metal lines in a later lithography process. Finally, interconnection lines 38 are then defined on the conductive layer 34 and the anti-reflection layer 36 to finish a layer of connections between active devices.

As is understood by a person skilled in the art, the foregoing descriptions of the preferred embodiment of the present invention is are illustrative of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method of metallization, said method comprising the steps of:

providing a semiconductor substrate with transistors formed over;

forming a dielectric layer over said substrate;

removing a portion of said dielectric layer to expose said substrate so as to form a contact hole;

forming a silicon layer over said contact hole and over said dielectric layer;

forming a titanium layer over said silicon layer;

performing a thermal process in a nitride containing environment to said substrate so as to form a titanium silicide and a titanium nitride layer;

forming a tungsten plug in said contact hole;

forming a conductive layer over said substrate, said conductive layer being connected with said conductive plug; and defining interconnection lines on said conductive layer.

2. The method of claim 1 further comprising the step of:

forming an anti-reflection layer over said conductive layer before defining said interconnection lines.

3. The method of claim 2, wherein said anti-reflection layer comprises a titanium nitride layer.

4. The method of claim 1, wherein said dielectric layer comprises an undoped oxide layer and a doped oxide layer.

5. The method of claim 4, wherein said doped oxide layer comprises a borophosphosilicate glass layer.

6. The method of claim 1, wherein said silicon layer comprises an amorphous silicon layer with a thickness between about 200 to about 1000 angstroms.

7. The method of claim 1, wherein said titanium layer comprises a collimated titanium layer with a thickness between about 200 to about 1000 angstroms.

8. The method of claim 1, wherein said tungsten plug is formed by depositing and etching back a tungsten layer.

9. A method of forming connections on a semiconductor substrate with transistors formed over, said method comprising the steps of:

forming an undoped oxide layer over said substrate;

forming a doped oxide layer on said undoped oxide layer;

removing a portion of said undoped oxide layer and said doped oxide layer to expose an active region on said substrate so as to form a contact hole;

forming a silicon layer over said contact hole and over said doped oxide layer;

forming a titanium layer over said silicon layer;

performing a thermal process in a nitride containing environment to said substrate, said silicon layer and said titanium layer being annealed to form a titanium-silicide layer and a titanium nitride layer in said thermal process;

forming a tungsten plug in said contact hole;

forming a conductive layer over said substrate, said conductive layer being connected with said tungsten plug;

forming an anti-reflection layer over said conductive layer; and defining interconnection lines on said conductive layer and said anti-reflection layer.

10. The method of claim 9, wherein said anti-reflection layer comprises a titanium nitride layer.

11. The method of claim 9, wherein said doped oxide layer comprises a borophosphosilicate glass layer.

12. The method of claim 9, wherein said silicon layer comprises an amorphous silicon layer with a thickness between about 200 to about 1000 angstroms.

13. The method of claim 9, wherein said titanium layer comprises a collimated titanium layer with a thickness between about 200 to about 1000 angstroms.

14. The method of claim 9, wherein said tungsten plug is formed by depositing and etching back a tungsten layer.

* * * * *